United States Patent
Gu et al.

(10) Patent No.: US 12,390,809 B2
(45) Date of Patent: Aug. 19, 2025

(54) MICROFLUIDIC CHIP

(71) Applicants: Beijing BOE Sensor Technology Co., Ltd., Beijing (CN); BOE Technology Group Co., Ltd., Beijing (CN)

(72) Inventors: Le Gu, Beijing (CN); Yingying Zhao, Beijing (CN); Wenliang Yao, Beijing (CN); Bolin Fan, Beijing (CN); Yongjia Gao, Beijing (CN); Qiuxu Wei, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 732 days.

(21) Appl. No.: 17/600,294

(22) PCT Filed: Jan. 29, 2021

(86) PCT No.: PCT/CN2021/074457
§ 371 (c)(1),
(2) Date: Sep. 30, 2021

(87) PCT Pub. No.: WO2021/227567
PCT Pub. Date: Nov. 18, 2021

(65) Prior Publication Data
US 2022/0314217 A1    Oct. 6, 2022

(30) Foreign Application Priority Data
May 13, 2020    (WO) ................ PCT/CN2020/090005

(51) Int. Cl.
*B01L 3/00*    (2006.01)
*B81B 3/00*    (2006.01)

(52) U.S. Cl.
CPC ........ *B01L 3/50273* (2013.01); *B81B 3/0089* (2013.01); *B01L 2200/027* (2013.01);
(Continued)

(58) Field of Classification Search
None
See application file for complete search history.

(56) References Cited

U.S. PATENT DOCUMENTS 9,399,215 B2 *    7/2016    Cauley, III .......... B32B 38/0012
9,630,180 B2 *    4/2017    Srinivasan ........ B01L 3/502792
(Continued)

FOREIGN PATENT DOCUMENTS

CN    1737555 A    2/2006
CN    104266680 A    1/2015
(Continued)

OTHER PUBLICATIONS

International Search Report issued on Feb. 18, 2021 for application No. PCT/CN2020/090005 with English translation attached.
(Continued)

*Primary Examiner* — Lore R Jarrett
(74) *Attorney, Agent, or Firm* — Nath, Goldberg & Meyer; Joshua B. Goldberg (57) ABSTRACT

The present disclosure provides a microfluidic chip, and belongs to the field of biological detection technology. The microfluidic chip is divided into a middle region and a peripheral region surrounding the middle region; the middle region includes a liquid storage region and a detection region; the microfluidic chip includes a first substrate and a second substrate opposite to each other; the first substrate includes a first base plate and a first electrode layer; the second substrate includes a second base plate and a second electrode layer; wherein a liquid storage tank and a liquid inlet are on a side of the first base plate proximal to the (Continued)

second substrate, the liquid inlet penetrates through a bottom of the liquid storage tank; the liquid storage tank and the liquid inlet are both in the liquid storage region.

20 Claims, 8 Drawing Sheets

(52) U.S. Cl.
CPC .. *B01L 2200/0689* (2013.01); *B01L 2300/161* (2013.01); *B01L 2400/0427* (2013.01); *B81B 2201/057* (2013.01); *B81B 2203/033* (2013.01); *B81B 2203/0353* (2013.01); *B81B 2203/04* (2013.01)

(56) References Cited

U.S. PATENT DOCUMENTS

| | | | |
|---|---|---|---|
| 2006/0146099 | A1 | 7/2006 | Wang et al. |
| 2011/0300034 | A1 | 12/2011 | Mair et al. |
| 2012/0018306 | A1* | 1/2012 | Srinivasan ............ C30B 29/58 |
| | | | 204/450 |
| 2012/0021529 | A1 | 1/2012 | Nachef et al. |
| 2013/0271817 | A1 | 10/2013 | Jung et al. |
| 2015/0147195 | A1 | 5/2015 | Young et al. |
| 2016/0016170 | A1 | 1/2016 | Lay et al. |
| 2016/0175859 | A1 | 6/2016 | Yi et al. |
| 2017/0297029 | A1 | 10/2017 | Devoe et al. |
| 2019/0099756 | A1 | 4/2019 | Pang et al. |
| 2019/0107709 | A1 | 4/2019 | Hara et al. |
| 2020/0108396 | A1* | 4/2020 | Parry-Jones ...... B01L 3/502792 |
| 2020/0256830 | A1 | 8/2020 | Arai |
| 2020/0310106 | A1 | 10/2020 | Li et al. |

FOREIGN PATENT DOCUMENTS

| | | | |
|---|---|---|---|
| CN | 104492508 | A | 4/2015 |
| CN | 105408728 | A | 3/2016 |
| CN | 106140334 | A | 11/2016 |
| CN | 106622414 | A | 5/2017 |
| CN | 106807468 | A | 6/2017 |
| CN | 107971049 | A | 5/2018 |
| CN | 108393105 | A | 8/2018 |
| CN | 108405004 | A | 8/2018 |
| CN | 108465491 | A | 8/2018 |
| CN | 108620144 | A | 10/2018 |
| CN | 109248722 | A | 1/2019 |
| CN | 109261233 | A | 1/2019 |
| CN | 109415671 | A | 3/2019 |
| CN | 109557149 | A | 4/2019 |
| CN | 109603939 | A | 4/2019 |
| CN | 109759153 | A | 5/2019 |
| CN | 109772480 | A | 5/2019 |
| CN | 109894167 | A | 6/2019 |
| CN | 110882729 | A | 3/2020 |
| CN | 110935493 | A | 3/2020 |
| CN | 111065521 | A | 4/2020 |
| CN | 111108373 | A | 5/2020 |
| DE | 102010050679 | B3 | 3/2012 |
| EP | 3623462 | A1 | 3/2020 |
| JP | 2009532857 | A | 9/2009 |
| JP | 2011508224 | A | 3/2011 |
| JP | 2014525589 | A | 9/2014 |
| JP | 2017523412 | A | 8/2017 |
| JP | 2019025476 | A | 2/2019 |
| WO | 2009086403 | A2 | 7/2009 |
| WO | 2009137415 | A2 | 11/2009 |
| WO | 2015023747 | A1 | 2/2015 |
| WO | 2015137694 | A1 | 9/2015 |
| WO | 2018190336 | A1 | 10/2018 |
| WO | 2019099306 | A1 | 5/2019 |
| WO | 201917422 | A1 | 9/2019 |
| WO | 2019228035 | A1 | 12/2019 |

OTHER PUBLICATIONS

Lin, Yan-You; "Low Voltage DNA Sequencing Platform Utilizing Picofluidic Electrowetting Devices"; Department of Electrical and Computer Engineering Duke University. 2011.
Restriction Requirement issued Nov. 15, 2023, in parallel U.S. Appl. No. 17/271,297.
Office Action issue on Feb. 26, 2024, for U.S. Appl. No. 17/271,297.
First Office Action issued on Jul. 28, 2022 for application No. CN202180000102.1 with English translation attached.
First Office Action issued on Sep. 21, 2022 for application No. CN202080000724.X with English translation attached.
Li, et al.; "Hydrophilic coating treatment process on channel surface of POCT chips"; School of Mechanical Engineering, Dalian University of Technology, Dalian 116024, China, 2019.
Extended European Search report issued on Sep. 14, 2023 for application No. EP21773435.9.
Rejection of application issued on Sep. 23, 2023 for application No. CN202080000724.X with English translation attached.
First Office Action issued on Oct. 30, 2024, for Japanese Patent Application No. 2022-514564 with English translation attached.
Office Action dated May 27, 2025 issued in corresponding Japanese Application No. 2022-514564.

* cited by examiner

MICROFLUIDIC CHIP

This is a National Phase Application filed under 35 U.S.C. 371 as a national stage of PCT/CN2021/074457, filed Jan. 29, 2021, an application claiming the benefit of International Application No. PCT/CN2020/090005, filed May 13, 2020, the content of each of which is hereby incorporated by reference in its entirety.

TECHNICAL FIELD

The present disclosure relates to the field of biological detection technology, and in particular to a microfluidic chip.

BACKGROUND

The microfluid control technology may realize the accurate control and manipulation of micro-droplets. The digital microfluid control based on the dielectric wetting technology adopts an electrical signal to drive, which has the advantages of strong driving force, simple and convenient operation and control, simple chip structure, high automation degree and the like, and is an important component of a lab-on-a-chip system.

Digital Microfluidics (DMF) utilizes the electrowetting principle of droplets on a hydrophobic surface, and applies a control signal to an electrode array to cause a contact angle of the droplets to change, thereby realizing the accurate control of the droplets. Compared with the conventional flow channel type microfluidic chip, a power source of the digital microfluidic chip is an electric signal, and the digital microfluidic chip does not need a micro pump, a micro valve and other driving devices, and the chip structure and control are simple. The micro-channels in the digital microfluidic chip are not complex, a moving path of the droplets may be controlled by timing, and a plurality of micro droplets may be operated in parallel, improving the flux. The amount of the consumed reagent is less. The digital microfluidic chip has great advantages in the aspects of analysis scale, response speed, high flux and the like, and has wide research and application in the fields of biology, chemistry, medicine and the like.

SUMMARY

The invention aims to solve at least one of technical problems in the prior art and provides a microfluidic chip.

The embodiment of the present disclosure provides a microfluidic chip, including a middle region and a peripheral region surrounding the middle region; the middle region includes a liquid storage region and a detection region; the microfluidic chip includes a first substrate and a second substrate opposite to each other; the first substrate includes a first base plate and a first electrode layer on a side of the first base plate proximal to the second substrate; the second substrate includes a second base plate and a second electrode layer on a side of the second base plate proximal to the first substrate; wherein a liquid storage tank and a liquid inlet are on a side of the first base plate proximal to the second substrate, the liquid inlet penetrates through a bottom of the liquid storage tank; the liquid storage tank and the liquid inlet are both in the liquid storage region;

a cross section of the liquid storage tank taken along a thickness direction of the first substrate and a direction parallel to a direction in which the liquid storage region points towards the detection region has a first side proximal to the detection region; the first side has a first end point and a second end point, and the first end point is farther away from the second substrate than the second end point; an extending direction of a line connecting the first end point and the second end point is inclined with respect to an axial direction of the liquid inlet, and a distance from the first end point to an axis of the liquid inlet is smaller than a distance from the second end point to the axis of the liquid inlet.

In some embodiments, the first side is a straight side.

In some embodiments, an angle $\theta$ between the extending direction of the line connecting the first end point and the second end point and the axial direction of the liquid inlet is 30° or −60°.

In some embodiments, an interlayer dielectric layer is on a side of the second electrode layer distal to the second base plate; an angle between the extending direction of the line connecting the first end point and the second end point and the axial direction of the liquid inlet is $\theta$:

$\tan \theta > 2d(F-G)/\varepsilon_0\varepsilon_r V^2$, where $\varepsilon_0$ represents a vacuum dielectric constant; $\varepsilon_r$ represents a relative dielectric constant of the interlayer dielectric layer; d is a thickness of the interlayer dielectric layer; F represents a support force applied by the interlayer dielectric layer on a droplet to be detected; G represents the gravity of the droplet to be detected; V represents a voltage value applied to the second electrode layer.

In some embodiments, the liquid inlet includes a first port and a second port, and the liquid inlet is communicated with the liquid storage tank through the first port; an orthographic projection of the first port on the second base plate at least partially overlaps an orthographic projection of the second electrode layer on the second base plate.

In some embodiments, an orthographic projection of an edge of the second electrode layer on the second base plate passes through a center of the orthographic projection of the first port on the second base plate; or the orthographic projection of the edge of the second electrode layer on the second base plate is in contact with an edge of the orthographic projection of the first port on the second base plate.

In some embodiments, the liquid inlet includes a first port and a second port opposite to each other, and the liquid inlet is communicated with the liquid storage tank through the first port; an orthographic projection of the second port on the second base plate covers an orthographic projection of the first port on the second base plate.

In some embodiments, the microfluidic chip further includes a liquid inlet column; the liquid inlet column and the liquid inlet are coaxially arranged; the liquid inlet includes a first port and a second port opposite to each other, and the liquid inlet is communicated with the liquid storage tank through the first port; the liquid inlet column includes a third port and a fourth port opposite to each other; the third port of the liquid inlet column is connected with the second port of the liquid inlet.

In some embodiments, the microfluidic chip further includes a liquid inlet column; the liquid inlet column and the liquid inlet are coaxially arranged; the liquid inlet includes a first port and a second port opposite to each other, and the liquid inlet is communicated with the liquid storage tank through the first port; the liquid inlet column includes a third port and a fourth port opposite to each other; an orthographic projection of the third port of the liquid inlet column on the second base plate is in an orthographic projection of the fourth port on the second base plate.

In some embodiments, the first port and the second port of the liquid inlet have a same aperture.

In some embodiments, a sealant is between the first substrate and the second substrate and in the peripheral region and surrounds the middle region.

In some embodiments, a first receiving groove is on a side of the first base plate proximal to the second substrate, and the sealant is in the first receiving groove.

In some embodiments, a conductive component is between the first substrate and the second substrate and in the peripheral region, and is configured to electrically connecting the first electrode layer with a connection pad on the second substrate.

In some embodiments, a second receiving groove is on a side of the first base plate proximal to the second substrate, and the conductive component is in the second receiving groove.

In some embodiments, a support structure is between the first substrate and the second substrate, and is configured to maintain a cell gap between the first substrate and the second substrate.

In some embodiments, a gas outlet is on the first base plate and penetrates through the first base plate in a thickness direction.

In some embodiments, a first hydrophobic layer is on a side of the first electrode layer proximal to the second substrate; and a second hydrophobic layer is on a side of the second electrode layer proximal to the second substrate.

DETAIL DESCRIPTION OF EMBODIMENTS

To enable one of ordinary skill in the art to better understand technical solutions of the present disclosure, the present disclosure will be further described in detail below with reference to the accompanying drawings and exemplary embodiments.

Unless defined otherwise, technical or scientific terms used herein should have the same meaning as commonly understood by one of ordinary skill in the art to which the present disclosure belongs. The terms of "first", "second", and the like herein are not intended to indicate any order, quantity, or importance, but rather are used for distinguishing one element from another. Further, the terms of "a". "an", "the", or the like used herein does not denote a limitation of quantity, but rather denote the presence of at least one element. The term of "comprising", "including", or the like, means that the element or item preceding the term contains the element or item listed after the term and the equivalent thereof, but does not exclude the presence of other elements or items. The terms "connected", "coupled", and the like are not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
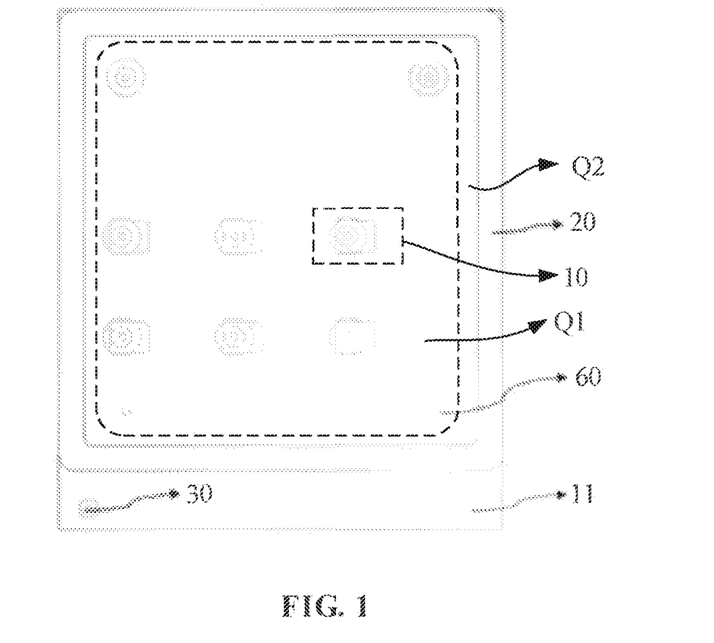
FIG. 1 is a top view of a microfluidic chip according to an embodiment of the present disclosure.
Figure 2:
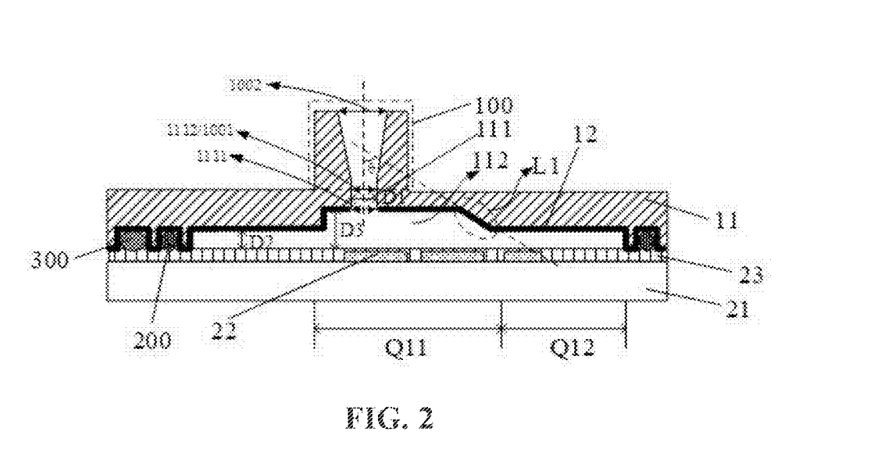
FIG. 2 is a cross-sectional view of a microfluidic chip according to an embodiment of the present disclosure.

FIG. 1 is a top view of a microfluidic chip according to an embodiment of the present disclosure; FIG. 2 is a schematic diagram of a microfluidic chip according to an embodiment of the present disclosure. As shown in FIGS. 1 and 2, embodiments of the present disclosure provide a microfluidic chip divided into a middle region Q1 and a peripheral region Q2 surrounding the middle region Q1; the middle region Q1 includes a plurality of test units 10, each of which includes a liquid storage region Q11 and a reaction region Q12; the plurality of test units 10 in the microfluidic chip may be, but are not limited to, arranged in an array. The microfluidic chip of the embodiment of the present disclosure includes a first substrate and a second substrate disposed opposite to each other; wherein the first substrate includes a first base plate 11, and a first electrode layer 12 and a first hydrophobic layer arranged on a side of the first base plate 11 proximal to the second substrate, wherein the first electrode layer 12 and the first hydrophobic layer cover the middle region Q1 and the peripheral region Q2; the second substrate includes a second base plate 21, and a second electrode layer 22 and a second hydrophobic layer arranged on a side of the second base plate 21 proximal to the first substrate.

FIG. 2 is a cross section obtained by cutting the microfluidic chip shown in FIG. 1 along a thickness direction thereof and a direction parallel to a direction in which the liquid storage region Q11 points towards the detection region Q12. Referring to FIG. 2, a liquid storage tank 112 is provided on the first base plate 11 proximal to the second substrate, and a liquid inlet 111 communicating with the liquid storage tank 112 is provided on the first base plate 11, and the liquid storage tank 112 and the liquid inlet 111 are located in the liquid storage region Q11. The cross section of the liquid storage tank 112 as shown in FIG. 2 has a first side L1 and a second side disposed opposite each other, and a bottom side; the first side L1 is closer to the detection region Q12 than the second side, and the first side L1 is inclined with respect to the bottom side. Specifically, the first side L1 has a first end point and a second end point opposite to each other, and the first end point is farther away from the second substrate than the second end point. For example: the first end point is a junction connecting the first side L1 and the bottom side, and the second end point is the other end point of the second side. A distance from the first end point to an axis of the liquid inlet 111 is smaller than a distance from the second end point to the axis of the liquid inlet 111. That is, an extending direction of a line connecting the first end point and the second end point of the first side L1 (a trend of the first side L1) is from the liquid storage region Q11 to the detection region Q12 in an inclined transition.

Since the trend of the first side L1 of the cross section of the liquid storage tank 112 shown in FIG. 2 runs from the liquid storage region Q11 to the detection region Q12. That is, a trend of a side wall of the liquid storage tank 112 on a side proximal to the detection region Q12 is inclined, i.e., is not vertically disposed relative to a bottom surface of the liquid storage tank 112. Thus, when a reaction liquid enters the liquid storage region Q11 through the liquid inlet 111, the motion resistance of the droplets moving to the detection region Q12 may be reduced.

In some examples, there is an angle θ between the trend of the first side L1 of the cross section of the liquid storage tank 112 shown in FIG. 2 (i.e., the line connecting the first end point and the second end point) and a direction of the axis of the liquid inlet 111, the angle θ is 30° or ~60°, for example 45°. The inclination angle of the side wall of the liquid storage tank 112 is set reasonably to effectively reduce the motion resistance of the droplets when moving.

In some examples, the microfluidic chip further includes an interlayer dielectric layer 23 disposed on a side of the second electrode layer 22 distal to the second base plate 21; the angle between the extending direction of the line connecting the first end point and the second end point of the first side L1 and the direction of the axis of the liquid inlet 111 is θ; $\tan\theta > 2d(F-G)/\varepsilon_0\varepsilon_r V^2$, where $\varepsilon_0$ represents a vacuum dielectric constant, $\varepsilon_r$ represents the relative dielectric constant of the interlayer dielectric layer; d is a thickness of the interlayer dielectric layer 23; F represents a support force applied by the interlayer dielectric layer 23 on the droplet to be detected; G represents the gravity of the droplet to be detected; V represents a voltage value applied to the second electrode layer. The interlayer dielectric layer may be a single-layer film, such as a polyimide film. Alternatively, the interlayer dielectric layer may also be a composite film of a polyimide film and a hydrophobic layer layer.

In some examples, the liquid storage tank 112 on the first base plate 11 may be a rectangular-like tank, i.e., having four side walls and a bottom wall; or may also be a cylindrical-like tank, i.e. having only one side wall and one bottom wall. The embodiment of the present disclosure will be described by taking an example in which the liquid storage tank 112 has four side walls and a bottom wall. For example: two side walls arranged opposite to each other in the direction that the liquid storage region Q11 points towards the detection region Q12 are respectively a first side wall and a second side wall, and the other pair of side walls arranged opposite to each other is a third side wall and a fourth side wall; wherein, a dihedral angle between the bottom wall and the second side wall, the third side wall or the fourth side wall is 90 degrees or approximately 90 degrees, and a dihedral angle between the bottom wall and the first side wall is an obtuse angle, for example in the range of 120 to 150 degrees. For example, the dihedral angle between the first side wall and the bottom wall is 135°. It should be noted that the dihedral angles described above refer to interior angles of the liquid storage tank 112. Alternatively, in the embodiment of the present disclosure, the second side wall, the third side wall and the fourth side wall may be disposed obliquely with respect to the bottom wall. In some examples, the dihedral angle between the bottom wall and the second side wall, the third side wall or the fourth side wall may be equal to the dihedral angle between the first side wall and the bottom wall.

Referring to FIG. 2, in some examples, the side walls of the liquid storage tank 112 have a smooth surface, such that the first side L1 of the cross section of the liquid storage tank 112 is a straight side. Alternatively, the surfaces of the side walls of the liquid storage tank 112 may be non-smooth, for example, the side wall has a step structure, but it is only necessary to ensure that the trend of the first side L1 of the cross section of the liquid storage tank 112 runs from the liquid storage region Q11 to the detection region Q12.

In some examples, the liquid storage tank 112 have a depth of about 200 μm to 500 μm and a volume of 5 μl to 100 μl. The depth of the liquid storage tank 112 may be reasonably designed to increase the storage capacity for the reaction liquid, so that the reagent amount entering the detection region Q12 is increased, and times of manually adding samples are effectively reduced.

In the embodiment of the present disclosure, the liquid inlet 111 penetrates through the bottom wall of the liquid storage tank 112, and the liquid inlet 111 may be cylindrical, conical, a combination of cylindrical and conical, and the like. Alternatively, a shape of the liquid inlet 11 needs to match a shape of a tip for the reaction liquid, so that the reaction liquid may be dropped into the liquid storage tank 112. The liquid inlet 111 according to the embodiment of the present disclosure is specifically described below.

In one example, as shown in FIG. 2, the microfluidic chip not only includes the above structure, but also includes a liquid inlet column 100. The liquid inlet 111 includes a first port 1111 and a second port 1112 which are oppositely arranged, and the liquid inlet column 100 includes a third port 1001 and a fourth port 1002 which are oppositely arranged; the liquid inlet 111 is communicated with the liquid storage tank 112 through the first port 1111 and is communicated with the liquid inlet column 100 through the second port 1112, and the second port 1112 of the liquid inlet 111 and the third port 1001 of the liquid inlet column 100 are a shared port. For example: the liquid inlet 111 and the liquid inlet column 100 are formed as a single-piece structure. The liquid inlet 111 and the liquid inlet column 100 which are formed as a single-piece structure are matched with the tip for the reaction liquid. Specifically, the liquid inlet 111 is matched with a liquid dropping end of the tip, and the liquid inlet column 100 is matched with a main body of the tip. For example: the liquid inlet 111 is cylindrical, and the liquid inlet column 100 is an inverted cone shape. That is, an orthographic projection of the fourth port 1002 of the liquid inlet 111 on the second base plate 21 covers an orthographic projection of the third port 1001 on the second base plate 21. In some examples, an aperture of the liquid inlet 111 is around 0.9 mm in order to match the liquid dropping end of the tip. In some examples, the liquid inlet column 100 and the first base plate 11 may be formed as a single-piece structure. For example, injection molding may be used to form the first base plate 11 and the liquid inlet column 100.

Figure 3:
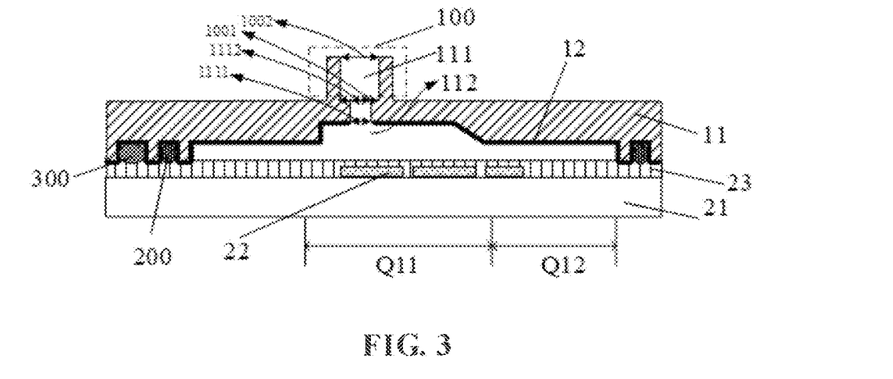
FIG. 3 is a cross-sectional view of a microfluidic chip according to an embodiment of the present disclosure.

In another example, FIG. 3 is a cross-sectional view of a microfluidic chip of an embodiment of the present disclosure. As shown in FIG. 3, the microfluidic chip further includes the liquid inlet column 100, the liquid inlet 111 includes the first port 1111 and the second port 1112 that are oppositely arranged, and the liquid inlet column 100 includes the third port 1001 and the fourth port 1002 that are oppositely arranged; the liquid inlet 111 is communicated with the liquid storage tank 112 through the first port 1111, and is communicated with the liquid inlet column 100 through the second port 1112. For example: the liquid inlet 111 and the liquid inlet column 100 are each of a cylindrical structure, and an aperture of the liquid inlet 11 is smaller than that of the liquid inlet column 100. That is, an orthographic projection of the third port 1001 of the liquid inlet column 100 on the second base plate 21 covers an orthographic projection of the second port 1112 of the liquid inlet 111 on the second base plate 21, so that the reaction liquid enters the liquid inlet 111 with the small aperture through the liquid inlet column 100 with the large aperture, and then enters the liquid storage tank 112, and a dropping speed of the reaction liquid may be slowed down through the liquid inlet 111 with the small aperture so as to avoid the problem that the reaction liquid in the liquid storage tank 112 cannot be effectively moved due to the accumulation of the reaction liquid. In some examples, the inlet column 100 and the first base plate 11 may be formed as a single-piece structure. For example, injection molding may be used to form the first base plate 11 and the inlet column 100.

Figure 4:
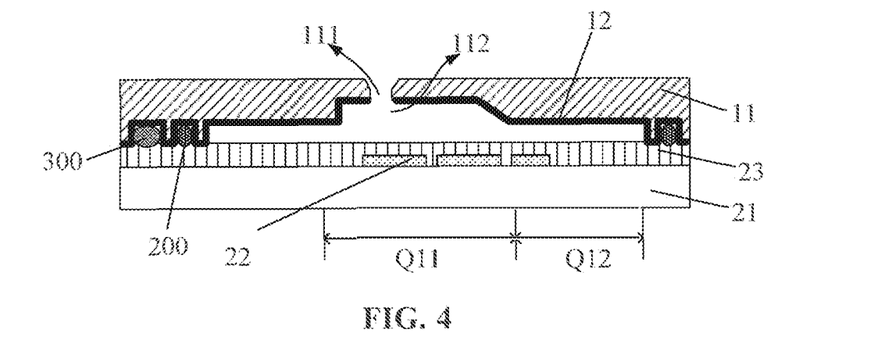
FIG. 4 is a cross-sectional view of a microfluidic chip according to an embodiment of the present disclosure.

In an example, FIG. 4 is a cross-sectional view of a microfluidic chip of an embodiment of the present disclosure. As shown in FIG. 4, the liquid inlet 111 of the first base plate 11 has the first port 1111 and the second port 1112 disposed opposite to each other, wherein the first port 1111 of the liquid inlet 111 is communicated with the liquid storage tank 112, and an aperture of the liquid inlet 111 proximal to the first port 1111 is not larger than an aperture of the liquid inlet 111 proximal to the second port 1112 in the direction in which the second port 1112 points towards the first port 1111. For example: the liquid inlet 111 includes a first sub-via and a second sub-via which are coaxially provided, and the first sub-via is cylindrical, the second sub-via is an inverted cone shape, an end of the first sub-via is communicated with the liquid storage tank 112, the other end is communicated with the second sub-via. In addition, the first sub-via and the second sub-via may be formed as a single-piece structure, and match with the liquid dropping end of the tip.

Figure 5:
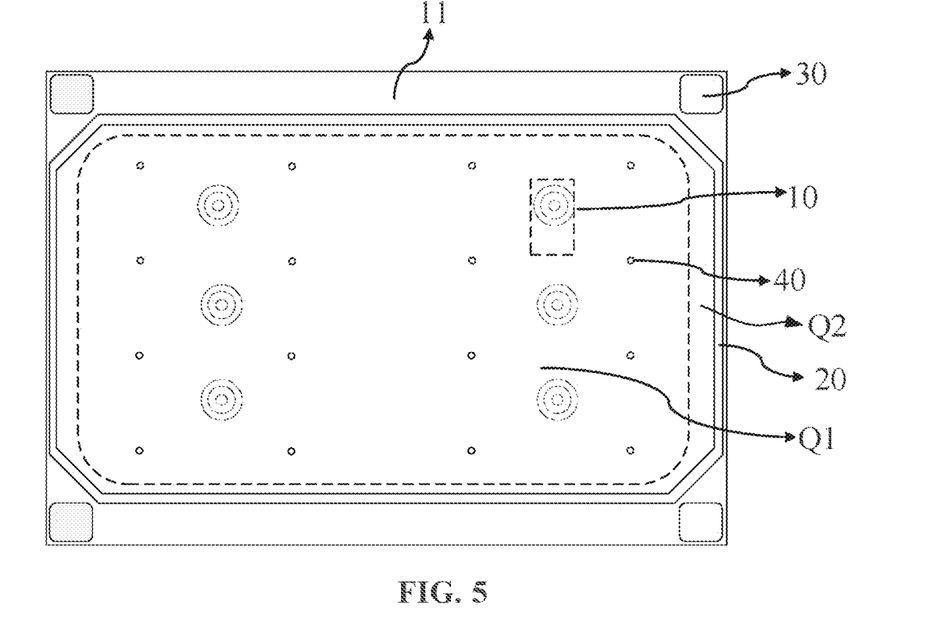
FIG. 5 is a top view of a microfluidic chip according to an embodiment of the present disclosure.
Figure 6:
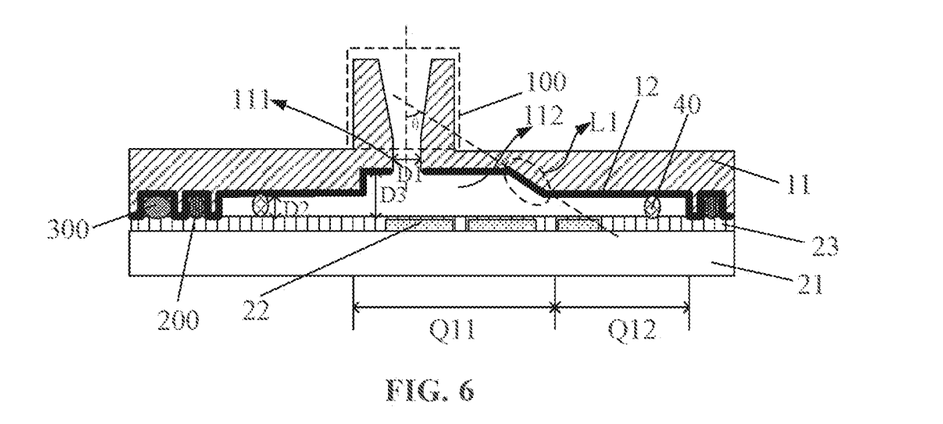
FIG. 6 is a cross-sectional view of a microfluidic chip in an embodiment of the present disclosure.

In some examples, FIG. 5 is a top view of a microfluidic chip of an embodiment of the present disclosure; FIG. 6 is a cross-sectional view of a microfluidic chip according to an embodiment of the present disclosure. The microfluidic chip in FIGS. 5 and 6 differs from that in FIGS. 1 and 2 only in that a support structure 40 is further disposed between the first substrate and the second substrate of the microfluidic chip, to maintain a cell gap between the first substrate and the second substrate, and the rest is substantially the same as that of the microfluidic chip shown in FIGS. 1 and 2, and therefore will not be described in detail herein. There may be a plurality of support structures 40, and the plurality of support structures 40 are arranged at intervals. For example: the plurality of support structures 40 are arranged in an array to provide a uniform cell gap between the first substrate and the second substrate. A thickness of the support structure 40 may be around 100 μm to 500 μm, but may be specifically set with reference to requirements on the cell gap between the first and second substrates. A shape of the support structure 40 may be cylindrical, oval, etc. The shape of the support structure 40 is not limited in the embodiment of the present disclosure.

In some examples, no matter which structure is adopted for the liquid inlet 111 on the first base plate 11, an orthographic projection of the first port 111 of the liquid inlet 111 on the second base plate 21 at least partially overlaps an orthographic projection of the second electrode layer 22 on the second base plate 21. That is, the reaction liquid entering the liquid storage tank 112 through the liquid inlet 111 may contact the second electrode layer 22, so as to ensure that the reaction liquid may be driven to move after the voltage is applied to the second electrode layer 22. For example: an orthographic projection of an edge of the second electrode layer 22 on the second base plate 21 passes through a center of the orthographic projection of the first port 1111 of the liquid inlet 111 on the second base plate 21. Alternatively, the orthographic projection of the first port 1111 of the liquid inlet 111 on the second base plate 21 is in contact with an edge of the orthographic projection of the second electrode layer 22 on the second base plate 21.

Three exemplary positional relationships between the liquid inlet 111 and the second electrode layer 22 are given below. In the drawings, it will be described by only taking an example in which the first port 111 of the liquid inlet 111 is a circular port. Alternatively, it should be understood that the first port 1111 of the liquid inlet 111 may be other shapes, for example: rectangular, oval, etc.

Figure 7:
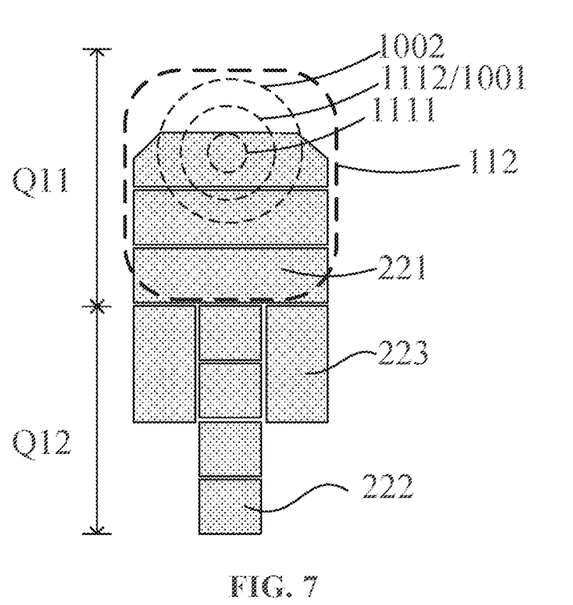
FIG. 7 is a diagram illustrating a positional relationship between a second electrode layer and a liquid inlet of a microfluidic chip according to an embodiment of the present disclosure.

In an example, FIG. 7 is a diagram of a positional relationship between the second electrode layer 22 and the liquid inlet 111 of a microfluidic chip according to an embodiment of the present disclosure. As shown in FIG. 7, the second electrode layer 22 may include a first electrode group located in the liquid storage region Q11 and a second electrode group located in the detection region Q12; the first electrode group includes a plurality of first sub-electrodes 221, and the second electrode group includes a plurality of second sub-electrodes 222 and a plurality of third sub-electrodes 223; wherein the first sub-electrodes 221 are arranged side by side and at intervals along the direction in which the liquid storage region Q11 points towards the detection region Q12. The first sub-electrodes 221 include, but are not limited to, strip-shaped (rectangular) electrodes. The second sub-electrodes 222 are arranged side by side and at intervals along the direction in which the liquid storage region Q11 points towards the detection region Q12. The second sub-electrodes 222 include, but are not limited to, block-shaped (square) electrodes. The third sub-electrodes 223 are separated from the second sub-electrodes 222 in a direction perpendicular to the direction in which the liquid storage region Q11 points towards the detection region Q12. The third sub-electrodes 223 are located on a side of the detection region Q12 proximal to the liquid storage region Q11. The third sub-electrodes 223 include, but are not limited to, strip-shaped (rectangular) electrodes. It should be noted that FIG. 6 shows a shape and an arrangement of each sub-electrode in the second electrode layer 22, and the shape of each sub-electrode in an actual product is not limited thereto, and any other shapes may be adopted. With reference to FIG. 7, the orthographic projection of the first port 1111 of the liquid inlet 111 on the second base plate 21 is inscribed with an orthographic projection of the first sub-electrode 221, which is farthest from the second electrode group, in the first electrode group, on the second base plate 21. In this case, the reaction liquid dropped through the liquid inlet 111 may directly drop on the second electrode layer 22, so that when a voltage is applied to the first sub-electrode 221, the reaction liquid may be effectively driven to move. In some examples, the second end point of the first side L1 of the liquid storage tank 112 is located between the first electrode group located in the liquid storage region Q11 and the second electrode group located in the detection region Q12, and an extending line of a side opposite to the first side L1 penetrates through a hole wall of the liquid inlet 111.

Figure 8:
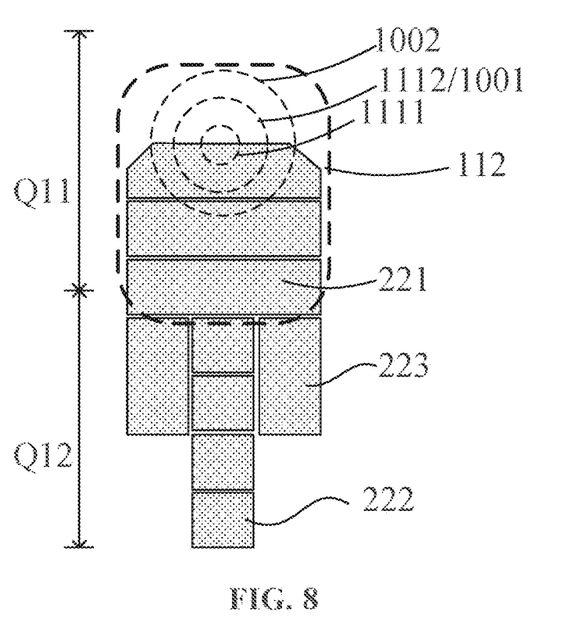
FIG. 8 is a diagram illustrating a positional relationship between a second electrode layer and a liquid inlet of a microfluidic chip according to an embodiment of the present disclosure.

In another example, FIG. 8 is a diagram illustrating a positional relationship between the second electrode layer 22 and the liquid inlet 111 of a microfluidic chip according to an embodiment of the present disclosure. As shown in FIG. 8, the structure of the second electrode layer 22 in the microfluidic chip adopts the same structure as that in FIG. 7, except that the center of the orthographic projection of the first port 1111 of the liquid inlet 111 on the second base plate 21 is located on an edge of the orthographic projection of the first sub-electrode 221, which is farthest from the second electrode group, in the first electrode group, on the second base plate 21. In this case, at least a portion of the reaction liquid dropped through the liquid inlet 111 may directly drop on the second electrode layer 22, so that when a voltage is applied to the first sub-electrode 221, the reaction liquid may be effectively driven to move.

Figure 9:
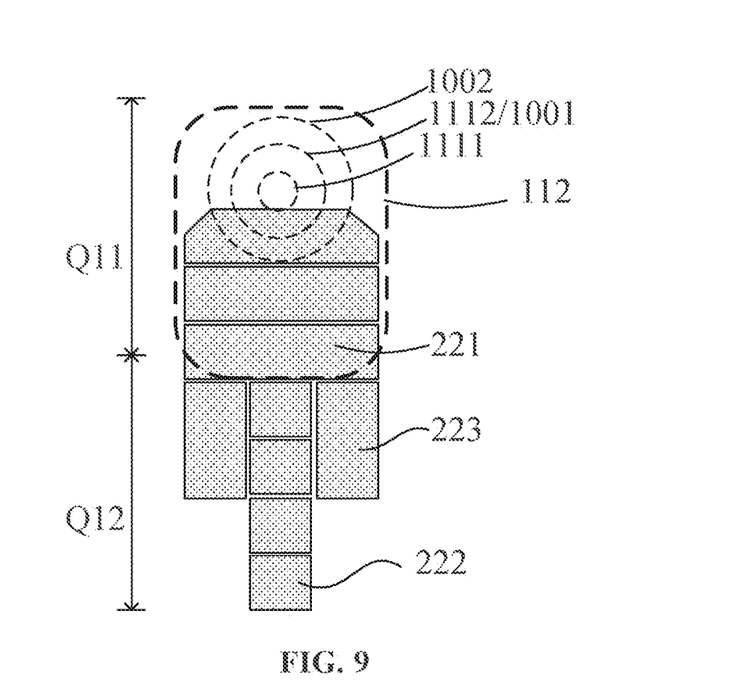
FIG. 9 is a diagram illustrating a positional relationship between a second electrode layer and a liquid inlet of a microfluidic chip according to an embodiment of the present disclosure.

In another example, FIG. 9 is a diagram of a positional relationship between the second electrode layer 22 and the liquid inlet 111 of a microfluidic chip according to an embodiment of the present disclosure. As shown in FIG. 9, the structure of the second electrode layer 22 in the microfluidic chip adopts the same structure as that in FIG. 7, except that the orthographic projection of the first port 1111 of the liquid inlet 111 on the second base plate 21 is circumscribed with an orthographic projection of the first sub-electrode 221 of the first electrode group, which is farthest from the second electrode group, on the second base plate 21. In this case, the reaction liquid dropped through the liquid inlet 111 contacts with the edge of the second electrode layer 22, so that when a voltage is applied to the first sub-electrode 221, the reaction liquid may be effectively driven to move.

It should be noted that only three schematic diagrams are shown to illustrate the positional relationship between the second electrode layer 22 and the liquid inlet 111 as above. In practical applications, there may be a distance between the orthographic projection of the first port 1111 of the liquid inlet 111 on the second base plate 21 and an edge of the second electrode layer 22, but the distance is necessarily satisfied such that an electric field force generated by applying the voltage to the second electrode layer 22 may drive the reaction liquid dropped through the liquid inlet 111 to move towards the detection region Q12.

In some examples, a sealant 200 is disposed in the peripheral region Q2 between the first substrate and the second substrate of the microfluidic chip to seal the microfluidic chip. The sealant 200 includes, but is not limited to, UV adhesive or double-sided adhesive. In addition, a certain cell gap is formed by aligning and assembling the first substrate and the second substrate and is used for providing a space for generating, splitting, and the like of microdroplets of the reaction liquid. In order to avoid the volatilization of the reaction liquid and the reduction of the driving voltage, silicone oil and fluorinated liquid are generally filled between the first substrate and the second substrate. In some examples, in order to prevent the sealant 200 from reacting with the silicone oil and the fluorinated liquid, a first receiving groove 20 surrounding the middle region Q1 is formed in the peripheral region Q2 of the first base plate 11, and the sealant 200 is formed in the first receiving groove 20. For example: the first receiving groove 20 and the first base plate 11 are formed as a single-piece structure, and may for example be formed by injection molding. In some examples, a depth of the first receiving groove 20 is about 50 μm to 2 mm. In an alternative manner, the depth of the first receiving groove 20 is set according to a thickness of the sealant 200, and with reference to the requirements on the cell gap between the first substrate and the second substrate.

In some embodiments, a conductive component 300 is disposed in the peripheral region Q2 between the first substrate and the second substrate of the microfluidic chip, and is used for connecting the first electrode layer 12 with a conductive pad on the second substrate to provide an electrical signal to the first electrode layer 12. For example: the first electrode layer 12 may be a ground electrode, which extends to the peripheral region Q2 to be connected to the conductive component 300, which, in turn, is connected to a ground pad on the second substrate, so that the ground electrode is connected to the ground pad. In some examples, the conductive component 300 includes, but is not limited to, a conductive silver paste or conductive foam. In some examples, the conductive component 300 may be located on a side of the sealant 200 distal to the middle region Q1. For example: the microfluidic chip is quadrilateral, and the conductive component 300 is disposed at each of four corners of the first base plate 11. That is, one conductive component 300 is disposed at each corner. In some examples, a second receiving groove 30 is further disposed on a side of the first base plate 11 close to the second substrate, and the conductive component 30) is disposed in the second receiving groove 30. For example: the second receiving cavity 30 and the first base plate 11 are formed as a single-piece structure, and may be formed by injection molding. In some examples, a depth of the second receiving groove 30 is about 50 μm to 2 mm. In an alternative manner, the depth of the second receiving groove 30 is set according to a thickness of the conductive component 300, and also with reference to the requirements on the cell gap between the first substrate and the second substrate. In some examples, a shape of the second receiving groove 30 includes, but is not limited to, a rectangle, a square, a circle or a polygon, and the number of the second receiving grooves 30 is about 1 to 4.

In some examples, the first substrate includes not only the first electrode layer 12 described above, but also a first hydrophobic layer on a side of the first electrode layer 12 proximal to the second substrate. In this case, the reaction liquid is added into the microfluidic chip through the liquid inlet 111, and after the reaction liquid enters the liquid storage tank 112, the reaction liquid contacts a lower surface of the first substrate. Since the lower surface of the first substrate is provided with the first hydrophobic layer exhibiting hydrophobicity, the reaction liquid is less likely to remain on the lower surface of the first hydrophobic layer, and more likely to enter the liquid storage tank 112. Similarly, the second substrate includes not only the second electrode layer 22, but also a second hydrophobic layer on a side of the second electrode layer 22 proximal to the first substrate. When a voltage is applied to the first electrode layer 12 and the second electrode layer 22 to cause the reaction liquid entering the liquid storage tank 112 to move, since an upper surface of the second substrate is provided with the second hydrophobic layer exhibiting hydrophobicity, the reaction liquid is more easily moved, and the motion resistance of the reaction liquid may be effectively reduced. The first hydrophobic layer and the second hydrophobic layer include, but are not limited to, hydrophobic layers, and may be made of various types of materials, such as Teflon, perfluorinated resin (CYTOP), and other fluoropolymers, which are not limited herein.

In order to facilitate the droplets to enter a liquid cavity, in some examples, the first base plate 11 is provided with a gas outlet 60 penetrating through the first substrate 110 in a thickness direction, as shown in FIG. 1.

In some examples, the liquid inlet 111, the liquid storage tank 112, the first receiving groove 20, and the second receiving groove 30 on the first base plate 11 of the first substrate may be formed by micro-machining (e.g., injection molding, laser engraving, sand blasting, etc.).

In order to make the operating principle of the microfluidic chip according to the embodiment of the present disclosure more clear, the operating procedure of the microfluidic chip according to the embodiment of the present disclosure will be described by taking an example in which the structure shown in FIG. 7 is used as the second electrode layer 22.

Figure 10:
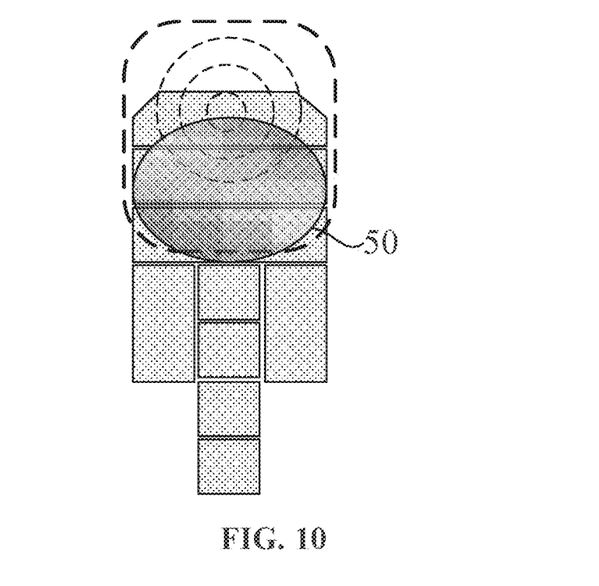
FIGS. 10 to 15 are schematic diagrams illustrating a procedure of splitting droplets by a microfluidic chip according to an embodiment of the present disclosure.
Figure 11:
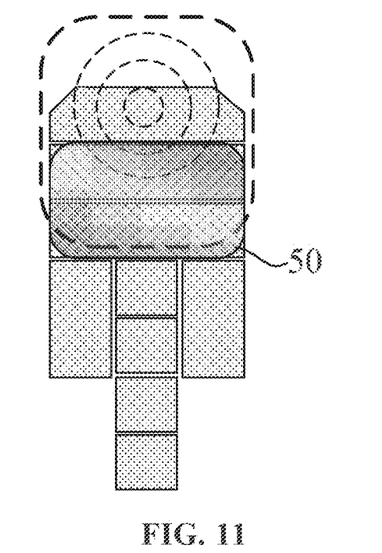
Figure 12:
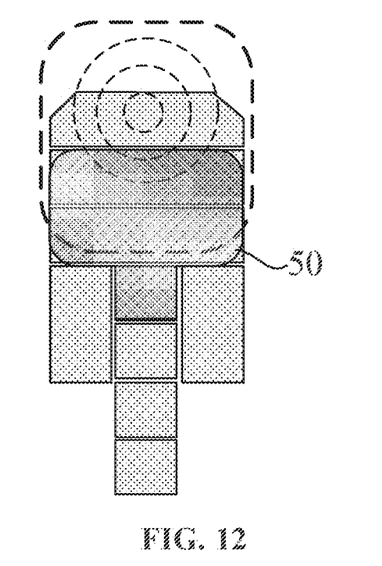
Figure 13:
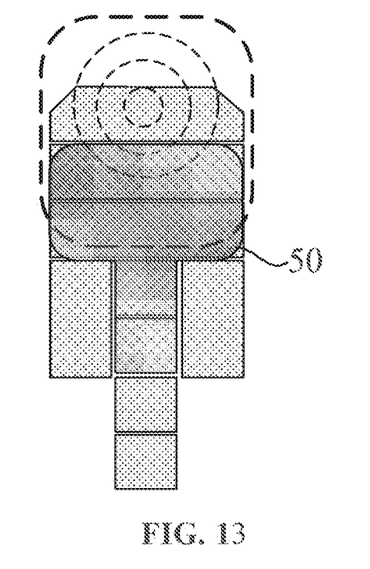
Figure 14:
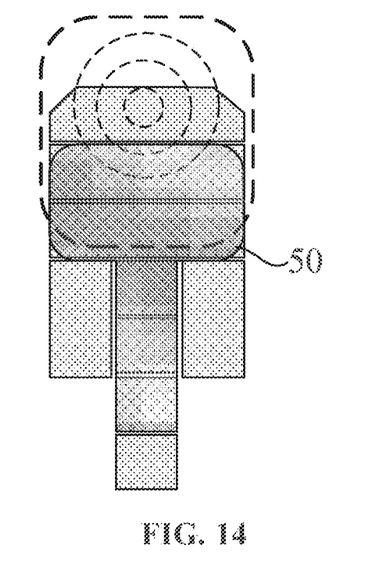
Figure 15:
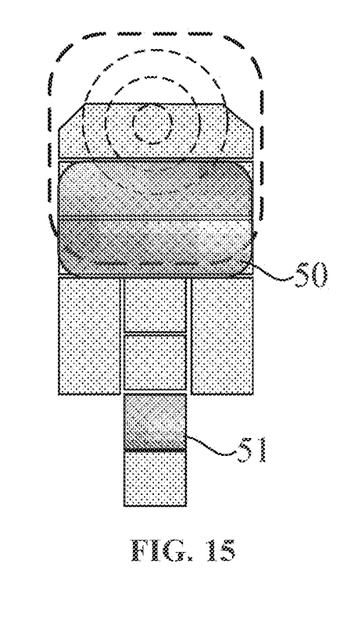

Firstly, the reaction liquid is added into the liquid storage tank 112 through the liquid inlet 111 by the tip, as shown in FIG. 10. Then, a reference voltage (such as, a ground voltage) is applied to the first electrode layer 12, and a voltage is sequentially applied to the first sub-electrodes 221 in the liquid storage region Q11 in a direction from the liquid storage region Q11 towards the reaction region Q12, so that the reaction liquid in the liquid storage region Q11 is formed as being rectangular, as shown in FIG. 11. It should be noted that when a voltage is applied to the next first sub-electrode 221, the voltage on the previous first sub-electrode 221 is removed. Then, a voltage is sequentially applied to the second sub-electrodes 222 in the detection region Q12 so that the reaction liquid is pulled into a cylinder-shaped structure, as shown in FIGS. 12 to 14. Finally, the voltage applied to the second sub-electrode 222 proximal to the liquid storage region Q11 is removed, and the voltage applied to the second sub-electrode 222 and the first sub-electrode 221 distal to the liquid storage region Q11 are maintained, so that a droplet is formed, as shown in FIG. 15.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A microfluidic chip, comprising:
   a middle region and a peripheral region surrounding the middle region; wherein the middle region comprises a liquid storage region and a detection region; the microfluidic chip comprises a first substrate and a second substrate opposite to each other; the first substrate comprises a first base plate and a first electrode layer on a side of the first base plate proximal to the second substrate; the second substrate comprises a second base plate and a second electrode layer on a side of the second base plate proximal to the first substrate; wherein
   the first substrate comprises a liquid storage tank on a side of the first base plate proximal to the second substrate and a liquid inlet on a side of the first base plate away from the second substrate, the liquid inlet penetrates through a surface of the liquid storage tank away from the second substrate; the liquid storage tank and the liquid inlet are both in the liquid storage region;
   a cross section of the liquid storage tank taken along a thickness direction of the first substrate and a direction parallel to a direction in which the liquid storage region points towards the detection region has a first side proximal to the detection region; the first side has a first end point and a second end point, and the first end point is farther away from the second substrate than the second end point; an extending direction of a line connecting the first end point and the second end point is inclined with respect to an axial direction of the liquid inlet, and a distance from the first end point to an axis of the liquid inlet is smaller than a distance from the second end point to the axis of the liquid inlet; and
   the liquid storage tank further comprises a second side opposite to the first side, and the other pair of sides arranged opposite to each other, which are a third side and a fourth side;
   wherein a dihedral angle between the surface and the second side, the third side or the fourth side is 90 degrees or approximately 90 degrees.

2. The microfluidic chip according to claim 1, wherein the first side is a straight side.

3. The microfluidic chip according to claim 1, wherein an angle θ between the extending direction of the line connecting the first end point and the second end point and the axial direction of the liquid inlet is 30° or −60°.

4. The microfluidic chip according to claim 1, wherein the liquid inlet comprises a first port and a second port, and the liquid inlet is communicated with the liquid storage tank through the first port; an orthographic projection of the first port on the second base plate at least partially overlaps an orthographic projection of the second electrode layer on the second base plate.

5. The microfluidic chip according to claim 4, wherein an orthographic projection of an edge of the second electrode layer on the second base plate passes through a center of the orthographic projection of the first port on the second base plate; or
   the orthographic projection of the edge of the second electrode layer on the second base plate is tangent to an edge of the orthographic projection of the first port on the second base plate.

6. The microfluidic chip according to claim 1, wherein the liquid inlet comprises a first port and a second port opposite to each other, and the liquid inlet is communicated with the liquid storage tank through the first port; an orthographic projection of the second port on the second base plate covers an orthographic projection of the first port on the second base plate.

7. The microfluidic chip according to claim 5, further comprising:
   a first hydrophobic layer which is on a side of the first electrode layer proximal to the second substrate; and
   a second hydrophobic layer which is on a side of the second electrode layer proximal to the first substrate.

8. The microfluidic chip according to claim 1, further comprising a liquid inlet column; wherein
   the liquid inlet column and the liquid inlet are coaxially arranged; the liquid inlet comprises a first port and a second port opposite to each other, and the liquid inlet is communicated with the liquid storage tank through the first port; the liquid inlet column comprises a third port and a fourth port opposite to each other; the third port of the liquid inlet column is connected with the second port of the liquid inlet.

9. The microfluidic chip according to claim 8, wherein the first port and the second port of the liquid inlet have a same aperture.

10. The microfluidic chip according to claim 8, further comprising:
    a first hydrophobic layer which is on a side of the first electrode layer proximal to the second substrate; and a second hydrophobic layer which is on a side of the second electrode layer proximal to the first substrate.

11. The microfluidic chip according to claim 1, further comprising a liquid inlet column; wherein the liquid inlet column and the liquid inlet are coaxially arranged; the liquid inlet comprises a first port and a second port opposite to each other, and the liquid inlet is communicated with the liquid storage tank through the first port; the liquid inlet column comprises a third port and a fourth port opposite to each other; an orthographic projection of the third port of the liquid inlet column on the second base plate is within an orthographic projection of the fourth port on the second base plate.

12. The microfluidic chip according to claim 11, further comprising:

a first hydrophobic layer which is on a side of the first electrode layer proximal to the second substrate; and
a second hydrophobic layer which is on a side of the second electrode layer proximal to the first substrate.

13. The microfluidic chip according to claim 1, further comprising a sealant which is between the first substrate and the second substrate and in the peripheral region and surrounds the middle region.

14. The microfluidic chip according to claim 13, further comprising a first receiving groove which is on a side of the first base plate proximal to the second substrate, wherein the sealant is in the first receiving groove.

15. The microfluidic chip according to claim 1, further comprising a conductive component which is between the first substrate and the second substrate and in the peripheral region, and is configured to electrically connect the first electrode layer with a connection pad on the second substrate.

16. The microfluidic chip according to claim 15, further comprising a second receiving groove which is on a side of the first base plate proximal to the second substrate, wherein the conductive component is in the second receiving groove.

17. The microfluidic chip according to claim 1, further comprising a support structure which is between the first substrate and the second substrate, and is configured to maintain a cell gap between the first substrate and the second substrate.

18. The microfluidic chip according to claim 1, further comprising a gas outlet which is on the first base plate and penetrates through the first base plate in a thickness direction.

19. The microfluidic chip according to claim 1, further comprising:

a first hydrophobic layer which is on a side of the first electrode layer proximal to the second substrate; and
a second hydrophobic layer which is on a side of the second electrode layer proximal to the first substrate.

20. The microfluidic chip according to claim 1, wherein the dihedral angle between the surface and the second side is 90 degrees or approximately 90 degrees; and the distance from the first end point to the axis of the liquid inlet is larger than a distance from the second side to the axis of the liquid inlet.

* * * * *